(12) United States Patent
Duffy

(10) Patent No.: US 10,551,827 B2
(45) Date of Patent: Feb. 4, 2020

(54) HYBRID INSPECTION SYSTEM FOR EFFICIENT PROCESS WINDOW DISCOVERY

(71) Applicant: KLA-Tencor Corporation, Milpitas, CA (US)

(72) Inventor: Brian Duffy, San Jose, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 183 days.

(21) Appl. No.: 15/727,212

(22) Filed: Oct. 6, 2017

(65) Prior Publication Data

US 2019/0033838 A1    Jan. 31, 2019

Related U.S. Application Data

(60) Provisional application No. 62/536,893, filed on Jul. 25, 2017.

(51) Int. Cl.
| | | |
|---|---|---|
| *G06F 17/50* | (2006.01) | |
| *G05B 19/418* | (2006.01) | |
| *G03F 7/20* | (2006.01) | |
| *G03F 1/84* | (2012.01) | |

(52) U.S. Cl.
CPC ..... *G05B 19/41875* (2013.01); *G03F 7/7065* (2013.01); *G03F 1/84* (2013.01); *G05B 2219/37224* (2013.01); *G05B 2219/45028* (2013.01); *G05B 2219/45031* (2013.01)

(58) Field of Classification Search
CPC .... G05B 19/41875; G05B 2219/37244; G60T 7/0002; G60T 7/0006; G60T 7/001; G03F 1/82; G03F 1/84; G03F 1/88; G03F 7/7065

USPC ........................................................ 716/51
See application file for complete search history.

(56) References Cited

U.S. PATENT DOCUMENTS

| | | |
|---|---|---|
| 6,902,855 B2 | 6/2005 | Peterson et al. |
| 7,418,124 B2 | 8/2008 | Peterson et al. |
| 7,676,077 B2 | 3/2010 | Kulkarni et al. |
| 7,729,529 B2 | 6/2010 | Wu et al. |

(Continued)

OTHER PUBLICATIONS

International Search Report and Written Opinion dated Nov. 6, 2018 for PCT/US2018/043351.

*Primary Examiner* — Paul Dinh
(74) *Attorney, Agent, or Firm* — Suiter Swantz pc llo

(57) ABSTRACT

An inspection system includes a controller communicatively coupled to a physical inspection device (PID), a virtual inspection device (VID) configured to analyze stored PID data, and a defect verification device (DVD). The controller may receive a pattern layout of a sample including multiple patterns fabricated with selected lithography configurations defining a process window, receive locations of PID-identified defects identified through analysis of the sample with the PID, wherein the PID-identified defects are verified by the DVD, remove one or more lithography configurations associated with the locations of the PID-identified defects from the process window, iteratively refine the process window by removing one or more lithography configurations associated with VID-identified defects identified through analysis of selected portions of stored PID data with the VID, and provide, as an output, the process window when a selected end condition is met.

32 Claims, 8 Drawing Sheets

(56) References Cited

U.S. PATENT DOCUMENTS

| | | | |
|---|---|---|---|
| 7,769,225 | B2 | 8/2010 | Kekare et al. |
| 7,877,722 | B2 | 1/2011 | Duffy et al. |
| 8,111,900 | B2 | 2/2012 | Wu et al. |
| 8,213,704 | B2 | 7/2012 | Peterson et al. |
| 9,183,624 | B2 | 11/2015 | Karsenti et al. |
| 9,222,895 | B2 | 12/2015 | Duffy et al. |
| 2006/0291714 | A1 | 12/2006 | Wu et al. |
| 2013/0279792 | A1 | 10/2013 | Hess et al. |
| 2016/0116420 | A1 | 4/2016 | Duffy et al. |
| 2016/0150191 | A1 | 5/2016 | Karsenti et al. |
| 2017/0160648 | A1 | 6/2017 | Tel et al. |
| 2017/0194126 | A1 | 7/2017 | Bhaskar et al. |
| 2017/0200265 | A1* | 7/2017 | Bhaskar ............... G06T 7/0006 |

* cited by examiner

HYBRID INSPECTION SYSTEM FOR EFFICIENT PROCESS WINDOW DISCOVERY

CROSS-REFERENCE TO RELATED APPLICATION

The present application claims the benefit under 35 U.S.C. § 119(e) of U.S. Provisional Application Ser. No. 62/536,893, filed Jul. 25, 2017, entitled HYBRID INSPECTOR FOR EFFICIENT NON-CONFORMANCE DISCOVERY, naming Brian Duffy as inventor, which is incorporated herein by reference in the entirety.

TECHNICAL FIELD

The present disclosure relates generally to inspection systems and, more particularly, to hybrid inspection systems for process window determination.

BACKGROUND

A process window of a semiconductor fabrication process (e.g., a lithographic processing step) represents a range of parameters for which patterns of interest may be reliably fabricated on a sample without substantive defects. The accurate determination of the process window is critical to providing both accuracy and throughput during fabrication. A process window that is too restrictive may place unnecessary burdens on a control system for controlling the relevant parameters, which may be near theoretical limits. Further, a process window that is too broad may result in the fabrication of defects, which may negatively impact device performance or result in device failure. However, process window qualification may typically be a time-intensive and expensive process. Accordingly, systems and methods to provide advanced process window qualification may be desirable.

SUMMARY

An inspection system is disclosed in accordance with one or more illustrative embodiments of the present disclosure. In one illustrative embodiment, the system includes a controller communicatively coupled to a physical inspection device (PID), a virtual inspection device (VID) configured to analyze stored PID data, and a defect verification device (DVD). In accordance with one or more illustrative embodiments of the present disclosure, the controller receives a pattern layout of a sample including multiple patterns fabricated with selected lithography configurations defining a process window. In accordance with one or more illustrative embodiments of the present disclosure, the pattern layout correlates locations of the plurality of patterns on the sample to the lithography configurations of the process window. In accordance with one or more illustrative embodiments of the present disclosure, the controller receives locations of PID-identified defects, wherein the PID-identified defects are verified by the DVD. In accordance with one or more illustrative embodiments of the present disclosure, the controller removes one or more lithography configurations associated with the locations of the PID-identified defects from the process window. In accordance with one or more illustrative embodiments of the present disclosure, the controller iteratively refines the process window by removing one or more lithography configurations associated with VID-identified defects identified through analysis of selected portions of stored PID data with the VID. In accordance with one or more illustrative embodiments of the present disclosure, the controller provides, as an output, the process window when a selected end condition is met.

An inspection system is disclosed in accordance with one or more illustrative embodiments of the present disclosure. In one illustrative embodiment, the system includes a physical inspection device (PID). In another illustrative embodiment, the system includes a virtual inspection device (VID) configured to analyze stored PID data. In another illustrative embodiment, the system includes a defect verification device (DVD). In another illustrative embodiment, the system includes a controller communicatively coupled to the PID, the VID, and the DVD. In accordance with one or more illustrative embodiments of the present disclosure, the controller receives a pattern layout of a sample including multiple patterns fabricated with selected lithography configurations defining a process window. In accordance with one or more illustrative embodiments of the present disclosure, the pattern layout correlates locations of the plurality of patterns on the sample to the lithography configurations of the process window. In accordance with one or more illustrative embodiments of the present disclosure, the controller receives locations of PID-identified defects identified through analysis of the sample with the PID, wherein the PID-identified defects are verified by the DVD. In accordance with one or more illustrative embodiments of the present disclosure, the controller removes one or more lithography configurations associated with the locations of the PID-identified defects from the process window. In accordance with one or more illustrative embodiments of the present disclosure, the controller iteratively refines the process window by removing one or more lithography configurations associated with VID-identified defects identified through analysis of selected portions of stored PID data with the VID. In accordance with one or more illustrative embodiments of the present disclosure, the controller provides, as an output, the process window when a selected end condition is met.

An inspection method is disclosed in accordance with one or more illustrative embodiments of the present disclosure. In one illustrative embodiment, the method includes receiving a pattern layout of a sample including multiple patterns fabricated with selected lithography configurations defining a process window. In accordance with one or more illustrative embodiments of the present disclosure, the pattern layout correlates locations of the plurality of patterns on the sample to the lithography configurations of the process window. In accordance with one or more illustrative embodiments of the present disclosure, the method includes inspecting the sample with a physical inspection device (PID) to generate PID-identified defects. In accordance with one or more illustrative embodiments of the present disclosure, the method includes verifying the PID-identified defects with a defect verification device (DVD). In accordance with one or more illustrative embodiments of the present disclosure, the method includes removing one or more lithography configurations associated with locations of the PID-identified defects from the process window. In accordance with one or more illustrative embodiments of the present disclosure, the method includes iteratively refining the process window by removing one or more lithography configurations associated with VID-identified defects identified through analysis of selected portions of stored PID data with the VID. In accordance with one or more illustrative embodiments of the present disclosure, the method includes providing, as an output, the process window when a selected end condition is met.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which.

DETAILED DESCRIPTION

Figure 1A:
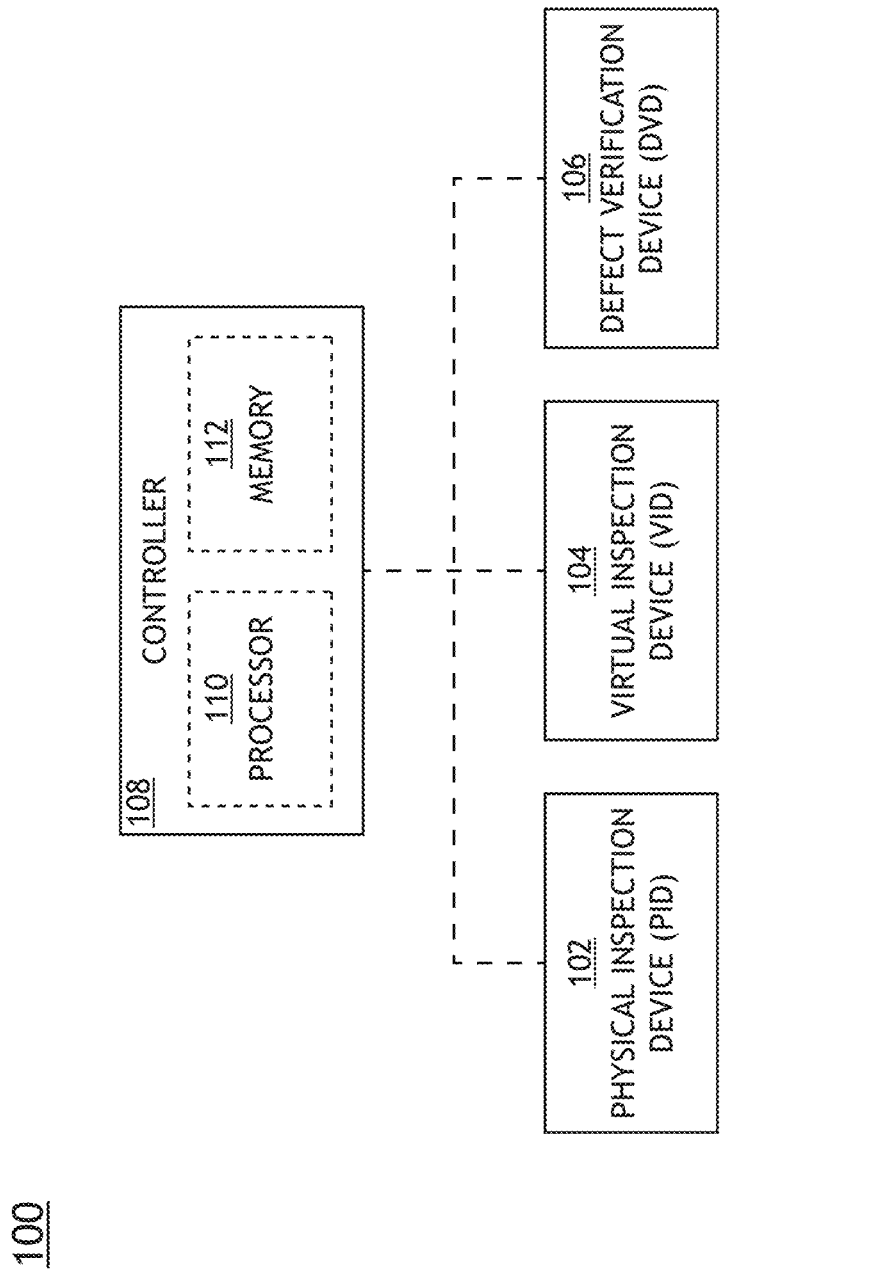
FIG. 1A is a conceptual view of a hybrid inspection system, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to a hybrid inspection system for efficiently determining a process window for a fabrication process. A hybrid inspection system may include, but is not required to include, a physical inspection device (PID) (e.g., an optical inspection system, an electron-beam (e-beam) inspection system, or the like), a virtual inspection device (VID) suitable for analyzing stored PID data, a defect verification device (DVD) for validating defects identified with the PID and/or the VID, and a controller. Additional embodiments of the present disclosure are directed to refining the candidate process window by iteratively removing from the process window lithography configurations (e.g., particular sets of process parameters) that result in fabrication defects on at least one pattern of interest (POI) within selected evaluation criteria.

A process window of a fabrication process may represent a range of lithography configurations (e.g., conditions, parameters, or the like) suitable for fabricating a selected set of patterns on a wafer within a desired specification. For example, a process window may define limits on the defocus associated with the position of the sample along the optical axis of the lithography tool (e.g., the focal position of the sample). By way of another example, a process window may define limits on the dose of energy from the illumination source incident on the sample (e.g., the exposure of the sample). Further, the impacts of variations of multiple process parameters on one or more characteristics of the printed features may be interdependent. In this regard, a process window may include a multi-dimensional representation of multiple process parameters (e.g., a focus-exposure matrix (FEM), or the like) defining acceptable ranges of process parameters of interest. Accordingly, precise monitoring of process parameters such as, but not limited to, focal position of the sample and the dose of energy incident on the sample from an illumination source may facilitate performance of lithography tools according to desired specifications.

Additional embodiments of the present disclosure are directed to performing process window qualification (PWQ) by analyzing a test sample (e.g., a design of experiments (DOE) sample, a modulation sample, or the like) on which a variety of POI are fabricated with systematically varying lithography configurations representative of a candidate process window. In this regard, lithography configurations (e.g., particular values on a FEM, or the like) for which one or more POI are fabricated with defects may be removed from the candidate process window. Accordingly, a process window may be generated for each POI and/or the entire set of POI relevant for a particular fabrication step.

It is typically desirable to precisely characterize the process window for the fabrication of patterns of interest (POI) with a fabrication process to the extent possible and/or practical. For example, relevant process parameters (e.g., focus of the sample, dose incident on the sample, or the like) may be controlled using a control system to remain within the process window. Accordingly, precise characterization of the process window may facilitate reliable performance of the lithography system with minimal fabrication errors and high throughput.

It is further desirable to efficiently determine the process window prior to production to streamline the pre-production process. It is recognized herein that process window qualification is a time-intensive process that may take multiple days to complete. A typical PWQ analysis may typically be performed with a high-resolution inspection system such as, but not limited to, a SEM capable of imaging the POI on a test sample. However, inspection using a single system with sufficient resolution to fully image the POI is typically impractical and/or undesirable due to the substantial time and/or computational resources required.

Accordingly, some inspection systems may determine the process window through a two-pass flow by identifying potential defect sites with a higher-throughput, often lower resolution, inspection system and then verifying only the identified potential defect sites with a high-resolution inspection system (verification system) such as a SEM. Further, multiple iterations of the two-pass flow may be required to reach a desired level of precision of the PWQ.

However, each transfer of a sample between different inspection systems may introduce significant delays that constrain the throughput of the system and risk sample contamination, which negatively impacts the accuracy and/or the efficiency of the process window determination. To mitigate the negative effects of sample transfer between the multiple inspection systems, each iteration may include analysis and subsequent verification of relatively large portions of the sample to ensure that sufficient data is collected to refine the process window. However, such a process is inefficient and may result in collection of a significant amount of unnecessary data.

Additional embodiments of the present disclosure are directed to determining the process window with a hybrid inspection system by inspecting, with a PID, a test sample, storing the PID data, and iteratively refining the process window through targeted analysis of the stored PID data with a VID. Hybrid inspection systems are generally described in U.S. Patent Publication No. 2017/0194126, entitled "Hybrid Inspectors" and published on Jul. 26, 2017), which is incorporated herein in its entirety. Each iteration of analysis may target a portion of the sample likely to include defects and thus likely to result in a reduction of the process window. Further, the sample need only be transferred a single time from the PID to the DVD, which may facilitate highly precise and efficient process window determination. For example, an entire sample (or a relevant portion of the sample) may be initially analyzed using the PID and subsequently transferred to the DVD. Once in the SEM, portions of the sample likely to include defects may be identified, relevant portions of stored PID data may be analyzed with the VID to identify patterns with potential defects, and the potential defects may be verified with the SEM. This process may be iterated any number of times without moving the sample. Further, various steps may be performed in parallel, further facilitating efficient detection of the process window.

Additional embodiments of the present disclosure are directed to correlating potential defects to specific patterns on the sample based on a known pattern layout of the sample. In this regard, potential defects identified with either the PID or the VID may be correlated to known pattern elements on the sample. Further embodiments of the present disclosure are directed to assigning a figure of merit (FOM) to the various POI based on the number of defects associated with the POI as well as the ranges of lithography configurations associated with the defects. For example, it may be the case that certain POI may be relatively robust and may fabricate without defects over a large range of lithography configurations (e.g., have a large process window), while other POI may be less robust and may fabricate without defects over a relatively small range of lithography configurations (e.g., have a small process window). In this regard, the FOM may be used to identify relatively weak patterns. Further, the relatively weak patterns may be preferentially targeted for analysis with the VID and SEM for efficient refinement of the process window.

Additional embodiments of the present disclosure are directed to correlating locations of POI fabricated with various lithography configurations to particular analysis regions of the PID (e.g., swaths or sub-swaths of a scanning tool, images of an imaging tool, or the like) and/or to particular fields of view of the DVD. In this regard, the particular patterns and associated lithography configurations used to fabricate the patterns may be indexed to known measurement regions of the PID and/or fields of view of the DVD. Further embodiments of the present disclosure are directed to assigning a learning potential to individual swaths or sub-swaths of the PID and/or each field of view of the DVD based on the figures of merit for included patterns (e.g., indicative of the relative robustness of the patterns to fabrication defects). Accordingly, the process window may be efficiently refined by prioritizing the analysis of swaths and/or fields of view expected to include a relatively high probability of defects.

Additional embodiments of the present disclosure are directed to updating the figures of merit and/or the learning potentials after each iteration of analysis with the VID and verification with the DVD. Thus, the results of each iteration of analysis may be utilized to influence the determination of the next portion of the sample most likely to include defects for efficient refinement of the process window. Further embodiments of the present disclosure are directed to utilizing machine learning algorithms (e.g., neural networks, and the like) to identify portions of the sample to analyze during each iteration based on the results of previous iterations.

Additional embodiments of the present disclosure are directed to terminating the refinement of the process window when a selected end condition is met. For example, refinement of the process window may terminate when the learning potential for all swaths falls below a selected threshold. By way of another example, refinement of the process window may terminate after a selected number of iterations of analysis with the VID and verification with the DVD. By way of a further example, refinement of the process window may terminate after a selected timeframe.

A hybrid inspection system 100 may thus provide highly efficiently process window qualification by iteratively refining the process window through targeted analysis of the stored PID data with a VID and verification with a DVD. For example, the hybrid inspection system 100 may prioritize the analysis of portions of the test sample having a large number and/or a diversity of POI identified as potentially including defects and thus maximize the impact or learning rate of each iteration. Further, once a defect is identified for a particular POI when fabricated with a particular lithography condition based on selected evaluation criteria, any repeated instances of the particular POI fabricated with the particular lithography condition (e.g., on the same die or different dies across the sample) need not be analyzed again. This may substantially limit the surface area of the sample that must be analyzed with the time-intensive DVD and may additionally limit unnecessary and redundant measurements.

As used throughout the present disclosure, the term "sample" generally refers to a substrate formed of a semiconductor or non-semiconductor material (e.g., a wafer, or the like). For example, a semiconductor or non-semiconductor material may include, but is not limited to, monocrystalline silicon, gallium arsenide, and indium phosphide. A sample may include one or more layers. For example, such layers may include, but are not limited to, a resist, a dielectric material, a conductive material, and a semiconductive material. Many different types of such layers are known in the art, and the term sample as used herein is intended to encompass a sample on which all types of such layers may be formed. One or more layers formed on a sample may be patterned or unpatterned. For example, a sample may include a plurality of dies, each having repeatable patterned features. Formation and processing of such layers of material may ultimately result in completed devices. Many different types of devices may be formed on a sample, and the term sample as used herein is intended to encompass a sample on which any type of device known in the art is being fabricated. For the purposes of the present disclosure, the term sample and wafer should be interpreted as interchangeable.

FIG. 1A is a conceptual view of a hybrid inspection system 100, in accordance with one or more embodiments of the present disclosure.

In one embodiment, the hybrid inspection system 100 includes a physical inspection device (PID) 102 for detecting potential fabrication defects on a physical sample including fabricated structures. For example, the PID 102 may include, but is not limited to, an optical inspection device or an electron-beam inspection device. In this regard, the PID 102 may generate data indicative of the fabricated structures on the test sample (e.g., one or more images of the fabricated structures). Additionally, the PID 102 may store or otherwise provide the generated data for further analysis.

In another embodiment, the hybrid inspection system 100 includes a virtual inspection device (VID) 104 for analyzing data from the PID 102 (e.g., stored PID data). The VID 104 may operate essentially in the same manner as a PID 102, except that the VID 104 may identify, and/or classify potential defects by analyzing data from the PID 102 rather than by analyzing a physical sample. In this regard, the VID 104 may facilitate the repeated analysis of a sample without requiring repeated physical measurements of the sample.

In another embodiment, the hybrid inspection system 100 includes a defect verification device (DVD) 106 for analyzing the physical sample to verify the potential defects identified by the PID 102 and/or the VID 104. For example, the DVD 106 may include, but is not limited to, a scanning electron microscope (SEM). In this regard, the DVD 106 may provide a relatively higher resolution analysis of the sample than the PID 102 such that the DVD 106 may identify defects with a higher accuracy than the PID 102. Consequently, the DVD 106 may have, but is not required to have, a relatively lower throughput than the PID 102.

Accordingly, the hybrid inspection system 100 may dynamically balance precision of the DVD 106 with detection speed of the PID 102 and/or the VID 104 to achieve a desired level of performance and throughput. Further, the hybrid inspection system 100 may implement iterative analysis of targeted portions of the sample without requiring multiple sample transfers. For example, the PID 102 may provide a first-pass defect identification analysis of the sample and may further provide output data suitable for subsequent analysis using the VID 104. The test sample may then be transferred to the DVD 106 for verification of the PID-identified defects. Subsequent analysis and verification steps may then be performed by the VID 104 and the DVD 106 in sequence or in parallel without further transfer of the test sample. Additionally, because the test sample remains in the DVD 106, each subsequent iteration may include analysis of small, targeted portions of the sample expected to provide relevant data for efficiently refining the process window.

In another embodiment, the hybrid inspection system 100 includes a controller 108. In another embodiment, the controller 108 includes one or more processors 110 configured to execute program instructions maintained on a memory medium 112. In this regard, the one or more processors 110 of controller 108 may execute any of the various process steps described throughout the present disclosure.

The one or more processors 110 of a controller 108 may include any processing element known in the art. In this sense, the one or more processors 110 may include any microprocessor-type device configured to execute algorithms and/or instructions. In one embodiment, the one or more processors 110 may consist of a desktop computer, mainframe computer system, workstation, image computer, parallel processor, or any other computer system (e.g., networked computer) configured to execute a program configured to operate the hybrid inspection system 100, as described throughout the present disclosure. It is further recognized that the term "processor" may be broadly defined to encompass any device having one or more processing elements, which execute program instructions from a non-transitory memory medium 112.

The memory medium 112 may include any storage medium known in the art suitable for storing program instructions executable by the associated one or more processors 110. For example, the memory medium 112 may include a non-transitory memory medium. By way of another example, the memory medium 112 may include, but is not limited to, a read-only memory, a random access memory, a magnetic or optical memory device (e.g., disk), a magnetic tape, a solid state drive and the like. It is further noted that memory medium 112 may be housed in a common controller housing with the one or more processors 110. In one embodiment, the memory medium 112 may be located remotely with respect to the physical location of the one or more processors 110 and controller 108. For instance, the one or more processors 110 of controller 108 may access a remote memory (e.g., server), accessible through a network (e.g., internet, intranet and the like). Therefore, the above description should not be interpreted as a limitation on the present invention but merely an illustration.

The controller 108 may be configured to receive data from the PID 102, the VID 104, and/or the DVD 106. For example, the controller 108 may receive any combination of raw data, processed data (e.g., inspection results), and/or partially-processed data. Further, the steps described throughout the present disclosure may be carried out by a single controller 108 or, alternatively, multiple controllers. Additionally, the controller 108 may include one or more controllers housed in a common housing or within multiple housings. In this way, any controller or combination of controllers may be separately packaged as a module suitable for integration into hybrid inspection system 100. For instance, the controller 108 may operate as a centralized processing platform for any of the inspection tools (e.g., the PID 102, the VID 104, and/or the DVD 106) and may implement one or more inspection algorithms to received data (raw and/or partially-processed) to determine the presence of defects on the sample. In another instance, the controller 108 may be distributed such that portions of the controller 108 may be implemented in and/or housed in any combination of the inspection tools.

The controller 108 may further direct any of the inspection tools to perform inspection steps. For example, the controller 108 may provide any of the PID 102, the VID 104, and/or the DVD 106 with inspection recipes including, but not limited to, inspection parameters (e.g., illumination intensity, detection gain, detection contrast, spot size, or the like) and locations on the sample for measurement by the PID 102 and/or the DVD 106.

In one embodiment, the controller 108 may receive or generate a master recipe suitable for directing the various components of the hybrid inspection system 100 (e.g., the PID 102, the VID 104, the DVD 106, or the like). For example, each component of the hybrid inspection system 100 may operate with a job queue including a series of analyses or measurements to be performed. Further, each component of the hybrid inspection system 100 may respond to recipes including, but not limited to, configuration parameters or control instructions.

Figure 1B:
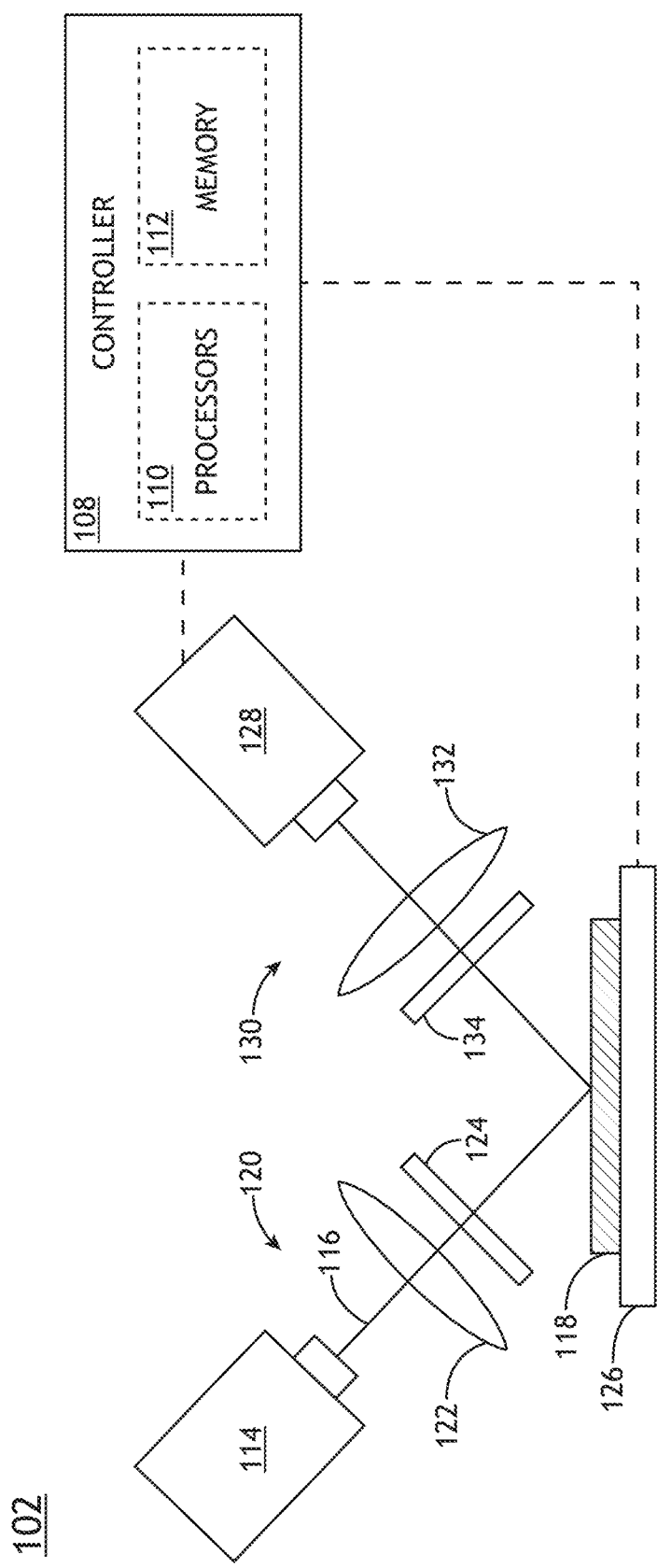
FIG. 1B is a conceptual view of a PID for scanning a focused optical illumination beam across a surface of a sample, in accordance with one or more embodiments of the present disclosure.
Figure 1C:
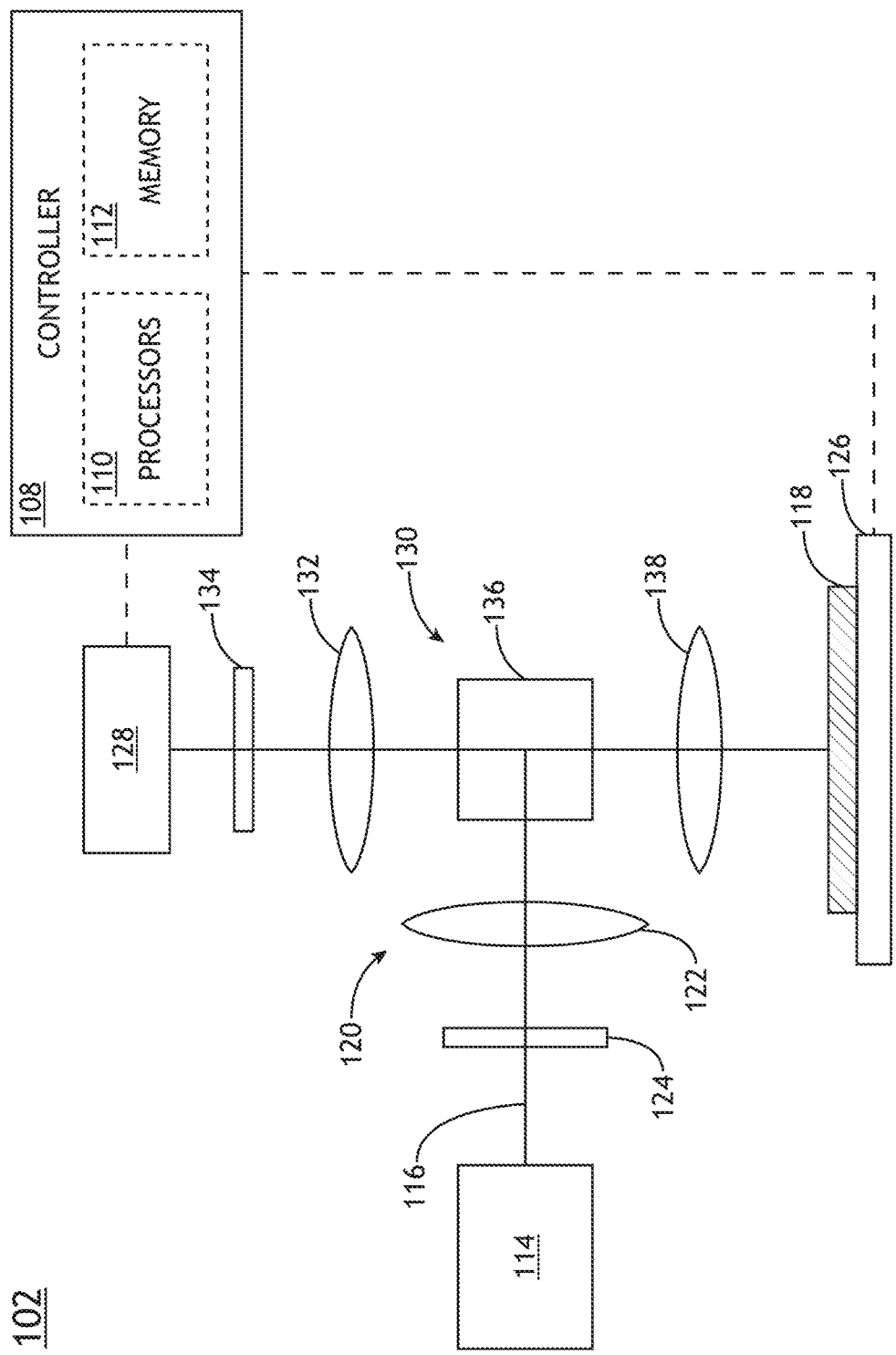
FIG. 1C is a conceptual view of a PID for imaging and/or scanning a sample, in accordance with one or more embodiments of the present disclosure.
Figure 1D:
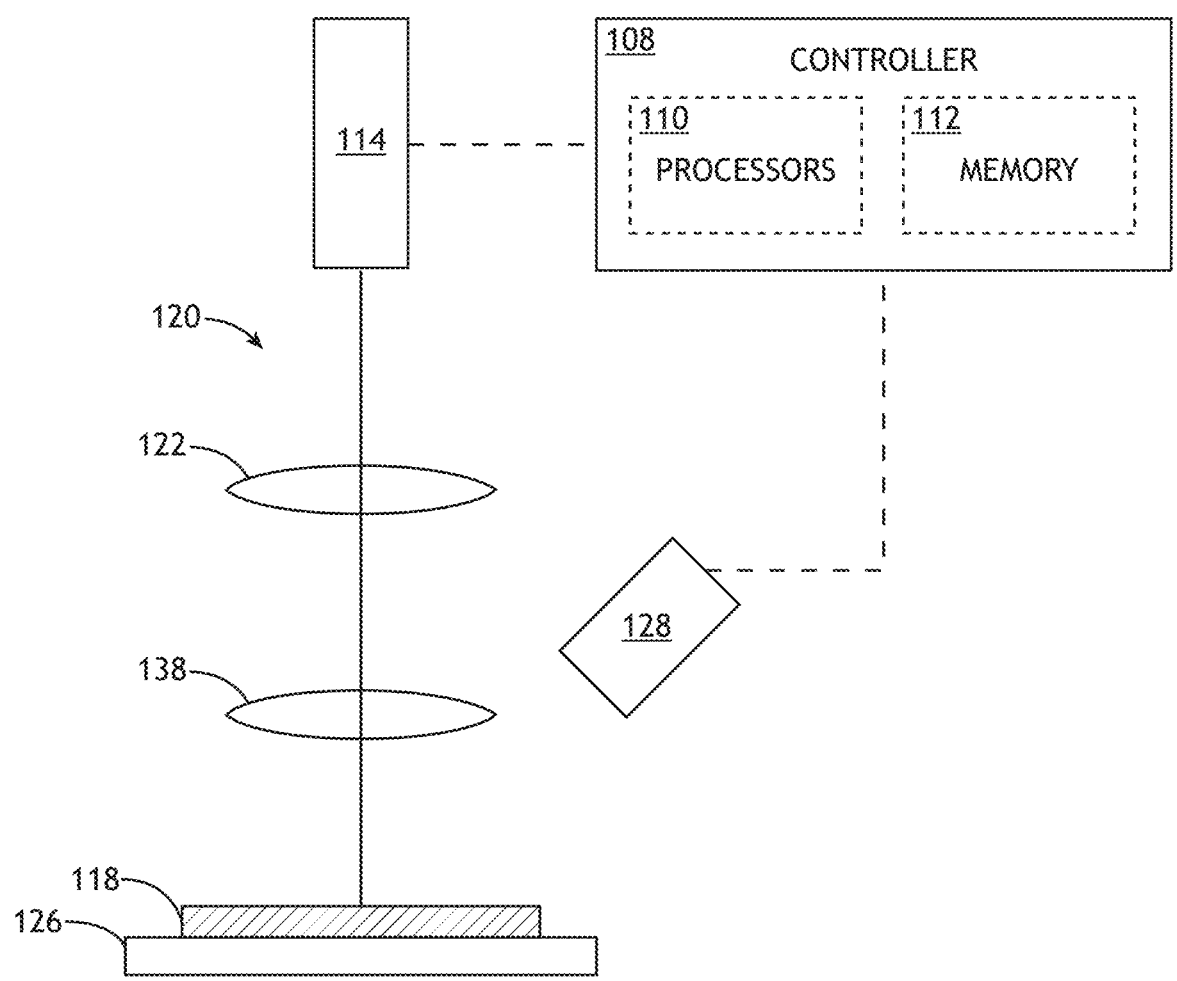
FIG. 1D is a conceptual view of a PID configured as a particle beam inspection system, in accordance with one or more embodiments of the present disclosure.

Referring now to FIGS. 1B through 1D, various components of the hybrid inspection system 100 are described in greater detail.

The PID 102 may include any type of inspection device known in the art suitable for inspecting a sample for defects. For example, the PID 102 may illuminate a sample with an illumination beam and may further collect radiation emanating from the sample in response to the illumination beam. The illumination beam may include any type of illumination beam suitable for probing a sample such as, but not limited to, a light beam (e.g., photons), an electron beam, or an ion beam. Further, the radiation emanating from the sample may include photons, electrons, ions, neutral particles, or the like. Accordingly, the PID 102 may include an optical inspection device, an e-beam inspection device, an ion-beam inspection device, or the like.

The PID 102 may further operate in either an imaging mode or a non-imaging mode. For example, the PID 102 operating in an imaging mode may illuminate a portion of the sample larger than the system resolution and capture an image of the illuminated portion of the sample on a detector. The captured image may be any type of image known in the art such as, but not limited to, a brightfield image, a darkfield image, a phase-contrast image, or the like. Further, captured images may be stitched together (e.g., by the PID 102, by the controller 108, or the like) to form a composite image of the sample. By way of another example, the PID 102 operating in a non-imaging mode may scan a focused beam across the sample and capture radiation and/or particles emanating from the sample on one or more detectors at one or more measurement angles. The focused beam may be scanned across the sample by modifying the beam path (e.g., using a galvo mirror, a piezo-electric mirror, or the like) and/or by translating the sample through a focal volume of the focused beam.

FIG. 1B is a conceptual view of a PID 102 for scanning a focused optical illumination beam across a surface of a sample, in accordance with one or more embodiments of the present disclosure.

In one embodiment, the PID 102 includes an illumination source 114 to generate an illumination beam 116. The illumination beam 116 may include one or more selected wavelengths of light including, but not limited to, ultraviolet (UV) radiation, visible radiation, or infrared (IR) radiation.

The illumination source 114 may be any type of illumination source known in the art suitable for generating an optical illumination beam 116. In one embodiment, the illumination source 114 includes a broadband plasma (BBP) illumination source. In this regard, the illumination beam 116 may include radiation emitted by a plasma. For example, a BBP illumination source 114 may include, but is not required to include, one or more pump sources (e.g., one or more lasers) configured to focus into the volume of a gas, causing energy to be absorbed by the gas in order to generate or sustain a plasma suitable for emitting radiation. Further, at least a portion of the plasma radiation may be utilized as the illumination beam 116.

In another embodiment, the illumination source 114 may include one or more lasers. For instance, the illumination source 114 may include any laser system known in the art capable of emitting radiation in the infrared, visible, or ultraviolet portions of the electromagnetic spectrum.

The illumination source 114 may further produce an illumination beam 116 having any temporal profile. For example, the illumination source 114 may produce a continuous illumination beam 116, a pulsed illumination beam 116, or a modulated illumination beam 116. Additionally, the illumination beam 116 may be delivered from the illumination source 114 via free-space propagation or guided light (e.g., an optical fiber, a light pipe, or the like).

In another embodiment, the illumination source 114 directs the illumination beam 116 to a sample 118 via an illumination pathway 120. The illumination pathway 120 may include one or more illumination pathway lenses 122 or additional optical components 124 suitable for modifying and/or conditioning the illumination beam 116. For example, the one or more optical components 124 may include, but are not limited to, one or more polarizers, one or more filters, one or more beam splitters, one or more diffusers, one or more homogenizers, one or more apodizers, or one or more beam shapers.

In another embodiment, the sample 118 is disposed on a sample stage 126. The sample stage 126 may include any device suitable for positioning and/or scanning the sample 118 within the PID 102. For example, the sample stage 126 may include any combination of linear translation stages, rotational stages, tip/tilt stages, or the like.

In another embodiment, the PID 102 includes a detector 128 configured to capture radiation emanating from the sample 118 through a collection pathway 130. The collection pathway 130 may include, but is not limited to, one or more collection pathway lenses 132 for collecting radiation from the sample 118. For example, a detector 128 may receive radiation reflected or scattered (e.g., via specular reflection, diffuse reflection, and the like) from the sample 118 via one or more collection pathway lenses 132. By way of another example, a detector 128 may receive radiation generated by the sample 118 (e.g., luminescence associated with absorption of the illumination beam 116, or the like). By way of another example, a detector 128 may receive one or more diffracted orders of radiation from the sample 118 (e.g., 0-order diffraction, ±1 order diffraction, ±2 order diffraction, and the like).

The detector 128 may include any type of detector known in the art suitable for measuring illumination received from the sample 118. For example, a detector 128 may include, but is not limited to, a CCD detector, a TDI detector, a photomultiplier tube (PMT), an avalanche photodiode (APD), or the like. In another embodiment, a detector 128 may include a spectroscopic detector suitable for identifying wavelengths of radiation emanating from the sample 118.

The collection pathway 130 may further include any number of optical elements 134 to direct and/or modify collected illumination from the sample 118 including, but not limited to one or more collection pathway lenses 132, one or more filters, one or more polarizers, or one or more beam blocks.

FIG. 1C is a conceptual view of a PID 102 for imaging and/or scanning a sample, in accordance with one or more embodiments of the present disclosure. In one embodiment, the detector 128 is positioned approximately normal to the surface of the sample 118. In another embodiment, the PID 102 includes a beamsplitter 136 oriented such that an objective lens 138 may simultaneously direct the illumination beam 116 to the sample 118 and collect radiation emanating from the sample 118. Further, the illumination pathway 120 and the collection pathway 130 may share one or more additional elements (e.g., objective lens 138, apertures, filters, or the like).

FIG. 1D is a conceptual view of a PID 102 configured as a particle beam inspection system, in accordance with one or more embodiments of the present disclosure. In one embodiment, the illumination source 114 includes a particle source (e.g., an electron beam source, an ion beam source, or the like) such that the illumination beam 116 includes a particle beam (e.g., an electron beam, a particle beam, or the like). The illumination source 114 may include any particle source known in the art suitable for generating an illumination beam 116. For example, the illumination source 114 may include, but is not limited to, an electron gun or an ion gun. In another embodiment, the illumination source 114 is configured to provide a particle beam with a tunable energy. For example, an illumination source 114 including an electron source may, but is not limited to, provide an accelerating voltage in the range of 0.1 kV to 30 kV. As another example, an illumination source 114 including an ion source may, but is not required to, provide an ion beam with an energy in the range of 1 to 50 keV.

In another embodiment, the illumination pathway 120 includes one or more particle focusing elements (e.g., illumination pathway lenses 122, collection pathway lenses 132, or the like). For example, the one or more particle focusing elements may include, but are not limited to, a single particle focusing element or one or more particle focusing elements forming a compound system. In another embodiment, the one or more particle focusing elements include objective lens 138 configured to direct the illumination beam 116 to the sample 118. Further, the one or more particle focusing elements may include any type of electron lenses known in the art including, but not limited to, electrostatic, magnetic, uni-potential, or double-potential lenses. It is noted herein that the description of a voltage contrast imaging inspection system as depicted in FIG. 1C and the associated descriptions above are provided solely for illustrative purposes and should not be interpreted as limiting. For example, the PID 102 may include any excitation source known in the art suitable for generating inspection data on a sample 118. In another embodiment, the PID 102 includes two or more particle beam sources (e.g., electron beam sources or ion beam sources) for the generation of two or more particle beams. In a further embodiment, the PID 102 may include one or more components (e.g., one or more electrodes) configured to apply one or more voltages to one or more locations of the sample 118. In this regard, the PID 102 may generate voltage contrast imaging data.

In another embodiment, the PID 102 includes one or more particle detectors 128 to image or otherwise detect particles emanating from the sample 118. In one embodiment, the detector 128 includes an electron collector (e.g., a secondary electron collector, a backscattered electron detector, or the like). In another embodiment, the detector 128 includes a photon detector (e.g., a photodetector, an x-ray detector, a scintillating element coupled to photomultiplier tube (PMT) detector, or the like) for detecting electrons and/or photons from the sample surface.

The DVD 106 may include any type of inspection or metrology system known in the art. In a general sense, the DVD 106 may include, but is not limited to, any of the inspectors illustrated in FIGS. 1B through 1D. The DVD 106 includes an inspector with a higher resolution than the PID 102 such that the DVD 106 may verify potential defects identified by the PID 102 and/or the VID 104 operating on PID data with a higher accuracy than obtainable with the PID 102.

In one embodiment, the DVD 106 includes a SEM. Further, the DVD 106 may include any type of SEM known in the art. For example, the DVD 106 may include a review SEM configured to provide a high magnification image of a potential defect and may thus have a relatively small FOV. By way of another example, the DVD 106 may include an inspection SEM (e.g., an e-beam inspection system, or the like) configured to provide a relatively larger FOV. In this regard, an inspection SEM may balance FOV and detection speed. By way of a further example, the DVD 106 may include a SEM configured for metrology such as, but not limited to, a critical dimension SEM (CD-SEM). For instance, a CD-SEM may utilize relatively low-energy electron beams such as, but not limited to, 1 keV or below to reduce charging and thereby generate highly sensitive images of small defects.

In another embodiment, the DVD 106 may dynamically switch between different measurement modes. For example, different types of defects and/or different POI may benefit from different measurement modes. In this regard, the controller 108 may provide recipes to the DVD 106 that provide measurement configurations (e.g., beam energy, sample bias, or the like).

In another embodiment, the DVD 106 includes multiple SEM devices that may be selectively used within the hybrid inspection system 100. For example, the DVD 106 may include a review SEM and a CD-SEM.

The VID 104 may include any device or combination of devices suitable for analyzing data generated by the PID 102 for defects. For example, the VID 104 may include one or more controllers (e.g., one or more processors coupled to memory suitable for executing program instructions as described previously herein). Virtual inspection systems are generally described in U.S. Pat. No. 9,222,895 entitled "Generalized Virtual Inspector" and granted on Dec. 29, 2015, and U.S. Patent Publication No. 2016/0150191 entitled "Virtual Inspection Systems for Process Window Characterization" and published on Nov. 20, 2015, which are both incorporated herein by reference in their entirety.

In one embodiment, the VID 104 includes a stand-alone computing device. For example, the VID 104 may include one or more processors coupled to memory and configured to execute program instructions for receiving and inspecting PID-generated data. The computing device of the VID 104 may be communicatively coupled to additional components of the hybrid inspection system 100 such as, but not limited to, the PID 102, a data storage unit (e.g., a database, a server, a memory unit, or the like), or the controller 108 to send or receive data, inspection results, or the like.

In another embodiment, the VID 104 is integrated within one or more components of the hybrid inspection system 100. In this regard, the VID 104 need not include a standalone computing system, but may be associated with functionality of another component within the hybrid inspection system 100. For example, the VID 104 may be integrated with the controller 108. By way of another example, the VID 104 may be integrated with the PID 102. In this regard, the PID 102 may be configured to inspect a physical sample for defects and may be additionally configured to inspect stored data from a previous measurement of a sample.

Figure 2:
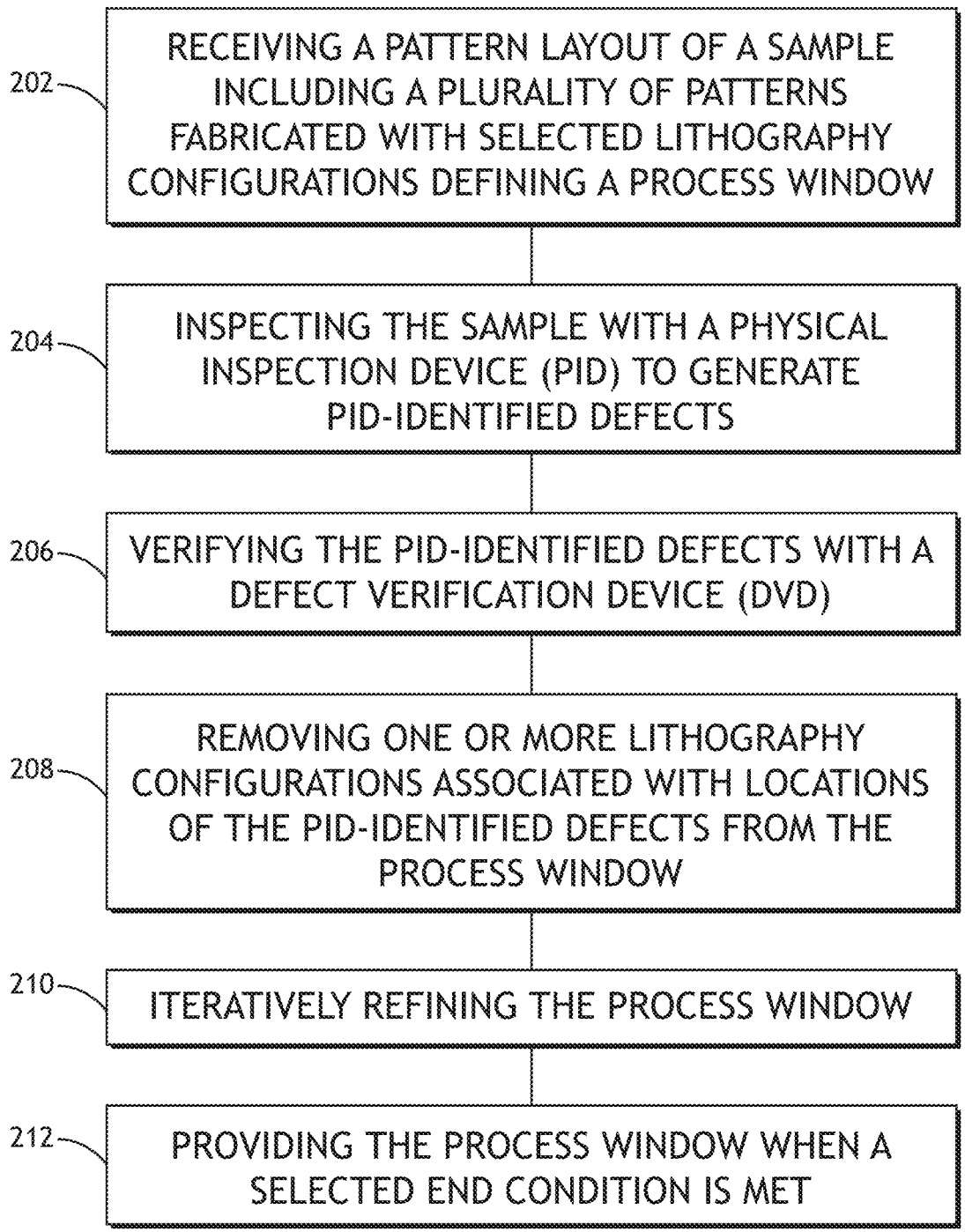
FIG. 2 is a flow diagram illustrating steps performed in a method for determining a process window, in accordance with one or more embodiments of the present disclosure.

FIG. 2 is a flow diagram illustrating steps performed in a method 200 for determining a process window, in accordance with one or more embodiments of the present disclosure. Applicant notes that the embodiments and enabling technologies described previously herein in the context of hybrid inspection system 100 should be interpreted to extend to method 200. It is further noted, however, that the method 200 is not limited to the architecture of hybrid inspection system 100.

As described previously herein, a process window may represent a range of lithography configurations (e.g., dose of illumination during an exposure step, focal position of the sample during exposure, or the like) for which one or more patterns of interest may be fabricated without defects according to a selected defect tolerance. Accordingly, each pattern of interest may have a pattern-specific window. Further, a given set of patterns of interest may have a process window in which each pattern may be fabricated without defects.

The process window may be initially defined as the range of lithography configurations utilized to generate the DOE sample. It is generally desirable to accurately determine the process window (e.g., the process window for the set of patterns on the DOE sample) such that the parameters of the lithography system may be well-controlled. Defining the process window too narrowly may place unnecessary burdens on the accuracy of the control system. In contrast, defining the process window too broadly may result in fabrication defects outside the selected defect tolerance.

It is recognized herein that a certain number or type of defects may be acceptable in a given fabrication step. Accordingly, the defect tolerance may define the acceptable limits for a particular fabrication run. In one embodiment, the defect tolerance is defect-specific. It may be the case that different types of defects may have different impacts on device performance. For example, defects such as increased edge roughness, rounding of pattern corners, or the like may be generally associated with decreased device performance (e.g., increased device resistance, increased residual capacitance, or the like), but may not lead to catastrophic failure. Such defects may be assigned a relatively high defect tolerance. In contrast, defects such as undesired bridges (e.g., electrical connections) between structures, undesired gaps (e.g., missing electrical connections) between structures, or the like may lead to catastrophic failure and may thus be assigned a relatively low defect tolerance.

In another embodiment, the defect tolerance is pattern-specific. For example, certain patterns may require more precise fabrication requirements than others, which may control relative defect tolerance values.

It is further recognized herein that defects may be associated with a variety of root causes. Accordingly, the tolerance to defects may vary according to root cause of the defect such that certain root causes may be identified and/or mitigated. For example, defects may be induced by fluctuations of components within a lithography system such as, but not limited to, fluctuations of a sample stage securing the sample, fluctuations of the intensity and/or spectral content of an illumination source, optical turbulence associated with heat generated in the lithography system, vibrations, or the like. These root causes may be mitigated to a certain extent by choice of materials and system design. By way of another example, stochastic processes such as, but not limited to photon shot noise may introduce stochastic (e.g., random) defects even under idealized stable conditions. Further, the prevalence of such stochastic processes may be inversely proportional to the illumination wavelength such that resulting defects may be increasingly prevalent as the illumination wavelength decreases. These root causes may represent more fundamental limitations of a particular system.

Regardless of the specific selected values of the defect tolerances or the method of selection, the process window represents the range of lithography configurations that provide acceptable fabrication. A separate process window may thus be determined for each pattern of interest (e.g., representing a range of lithography configurations for which a particular pattern may be fabricated) as well as for any selected set of patterns of interest (e.g., representing a range of lithography configurations for which all selected patterns may be fabricated).

In one embodiment, the method 200 includes a step 202 of receiving a pattern layout of a sample including a plurality of patterns fabricated with selected lithography configurations that define a process window. For example, the sample may include a DOE sample including patterns of interest fabricated with systematically-varying lithography configurations. The patterns of interest may include any type of pattern for which an accurate process window is desired such as, but not limited to, actual patterns to be fabricated on a particular layer of a semiconductor device, or representative patterns designed to be sensitive to particular lithography parameters (e.g., focus and/or dose-dependent metrology target patterns).

In another embodiment, the pattern layout includes the locations of the patterns of interest on the sample and the corresponding lithography configurations used in fabrication. In this regard, the pattern layout may operate as a look-up table for the patterns based on pattern type, lithography configuration, and/or location on the sample.

In another embodiment, the method 200 includes a step 204 of inspecting the sample with a physical inspection device (PID) (e.g., PID 102) to generate PID-identified defects. In another embodiment, the method 200 includes a step 206 of verifying the PID-identified defects with a defect verification device (DVD) (e.g., DVD 106). As described previously herein, the PID and the DVD may be complementary systems such that the PID may provide a relatively high-speed, low-resolution inspection, whereas the DVD may provide a relatively low-speed, high-resolution inspection. In this regard, the PID may rapidly identify potential defects that may be subsequently verified by the DVD to determine whether or not a defect is present.

The PID may implement any defect identification technique known in the art for identifying potential defects on pattern fabricated on the sample. For example, the PID may compare a pattern fabricated at a selected lithography configuration to a reference to identify potential defects. The reference may further include, but is not limited to, stored reference data or a control POI fabricated on the sample with a nominal lithography condition that does not include fabrication defects. Further, the PID may classify and/or sort identified potential defects for further analysis. Defect detection is generally described in U.S. Pat. No. 7,877,722 entitled "Systems and methods for creating inspection recipes" and issued on Jan. 25, 2011, U.S. Pat. No. 7,769,225 entitled "Methods and systems for detecting defects in a reticle design pattern" and issued on Aug. 3, 2010, and U.S. Pat. No. 8,213,704 entitled "Methods and systems for detecting defects in a reticle design pattern" and issued on Jul. 3, 2012, all of which are incorporated herein in their entirety. By way of another example, the PID may identify defects at least in part using design data such as, but not limited to, the designed geometry, physical layout, material properties, or electrical properties of patterns. Defect detection using design data is described generally in U.S. Pat. No. 7,676,077 entitled "Methods and systems for utilizing design data in combination with inspection data" and issued on Mar. 9, 2010, U.S. Pat. No. 7,729,529 entitled "Computer-implemented methods for detecting and/or sorting defects in a design pattern of a reticle" and issued on Jun. 1, 2010, and U.S. Pat. No. 9,183,624 entitled "Detecting defects on a wafer with run time use of design data" and issued on Nov. 10, 2015, all of which are incorporated herein by reference in their entirety. Detection and sorting of defects in a design pattern is generally described in U.S. Pat. No. 8,111,900 entitled "Computer-implemented methods for detecting and/or sorting defects in a design pattern of a reticle" and issued on Feb. 7, 2012, which is incorporated herein by reference in its entirety.

It may be the case that the PID may not be able to clearly resolve all patterns of interest on the sample if features are smaller than the resolution of the PID. Nonetheless, the PID may still be able to identify potential defects on a sample. For example, a comparison of an image of a pattern including a fabrication defect and a nominal non-defective pattern may provide an indication of the fabrication defect, even if the defect may not be fully resolved.

In another embodiment, the PID provides a recordable physical measurement of the sample. Data generated from the PID may thus be suitable for storage and subsequent analysis (e.g., by the VID). For example, the PID may provide a composite image of the sample suitable for storage either locally on the PID or on a separate storage device such as, but not limited to, a server, a non-volatile storage drive, or the like.

In another embodiment, patterns of interest (e.g., patterns on the DOE sample for which a process window is being determined) are assigned a pattern confidence value, which may operate as a figure of merit indicative of the susceptibility to defects within the process window. For example, the pattern confidence value may indicate a degree of confidence that the pattern-specific process window for a particular pattern is known within a selected accuracy. Further, this pattern confidence value may be refined or updated at any point as more information regarding the process window is considered.

Patterns of interest may be assigned any confidence value prior to inspection by the PID in step 204. In one embodiment, all patterns of interest are assigned a common pattern confidence value prior to PID inspection. In this regard, no assumptions are made about the susceptibility of any pattern to defects within the process window defined by the DOE sample. In another embodiment, patterns of interest are assigned different pattern confidence values prior to PID inspection. Pre-inspection pattern confidence levels may incorporate any number of factors that may influence the expectation that a corresponding measurement will facilitate refining the process window. For example, pattern confidence values may be assigned based on design data such as, but not limited to, data associated with the physical size, shape, or orientation of patterns, the materials out of which patterns are made, optical properties of patterns, or electrical properties of patterns. In this regard, known design characteristics of patterns may provide a basis for assigning different pattern confidence levels to different patterns before any analysis or inspection is performed. By way of another example, pattern confidence values may be assigned based on process simulations such as, but not limited to, optical proximity correction (OPC) simulations.

In another embodiment, the pattern layout is mapped to measurement regions of the PID and/or the DVD. The PID and/or the DVD may include a predetermined measurement pattern for the physical measurement of the sample. For example, the PID and/or the DVD may measure the sample through a series of scanning swaths, images, or the like associated with the motion of the illumination beam across the sample. Accordingly, the pattern layout may map the various fabricated patterns and the corresponding lithography configurations to specific measurement regions (e.g., swaths, images, fields of view, or the like) of the PID and/or the DVD.

Figure 3A:
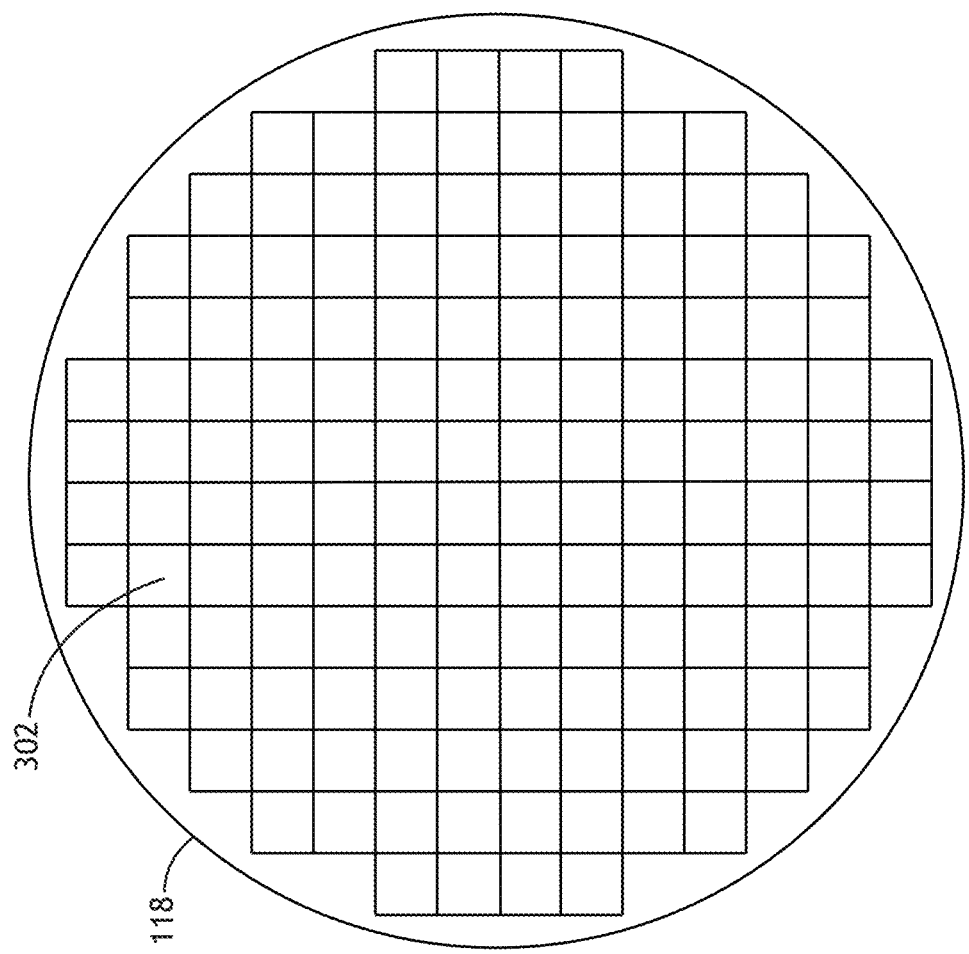
FIG. 3A is a top view of a sample for process window qualification, in accordance with one or more embodiments of the present disclosure.

FIG. 3A is a top view of a sample 118 (e.g., a DOE sample, or the like) for process window qualification, in accordance with one or more embodiments of the present disclosure. In one embodiment, the sample 118 includes a plurality of dies 302 including patterns of interest fabricated with varying lithography configurations. The dies may have any arrangement of patterns of interest suitable for process window qualification. For example, each die 302 may include a common set of patterns of interest such that the different dies 302 may provide data for each pattern of interest at different lithography configurations. By way of another example, different dies 302 may include different patterns of interest. Further, the dies 302 may be arranged in any manner on the sample 118 suitable. For example, the sample 118 may include reference dies dispersed throughout the sample 118 fabricated at nominal lithography configurations (e.g., those for which defects are not generated during fabrication) such that dies 302 fabricated with varying lithography configurations may be compared to the reference dies during inspection to detect defects. In one instance, the dies 302 may be, but are not required to be, arranged in sets of three including a reference die fabricated with a nominal lithography configuration and two test dies fabricated with a selected lithography configuration. In this regard, the two test ties may be directly compared with the reference die during inspection.

Figure 3C:
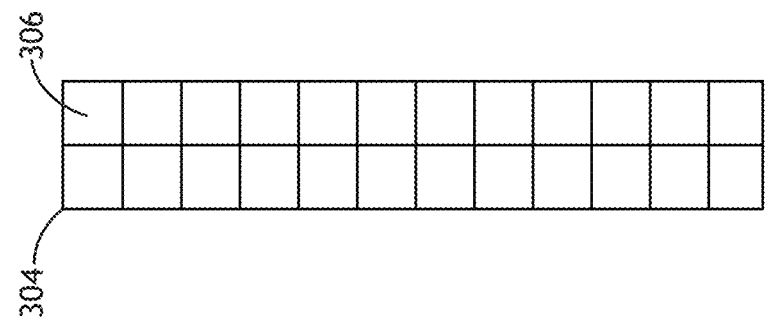
FIG. 3C is a top view of a single swath illustrating multiple fields of view of a DVD, in accordance with one or more embodiments of the present disclosure.
Figure 3B:
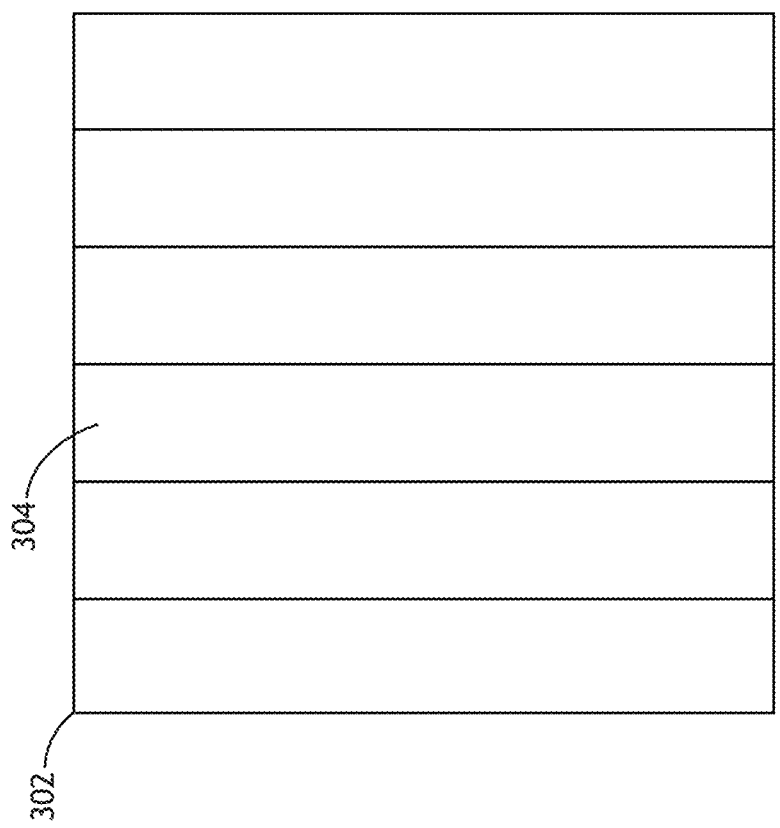
FIG. 3B is a top view of a single die illustrating multiple swaths of a scanning PID, in accordance with one or more embodiments of the present disclosure.

FIG. 3B is a top view of a single die 302 illustrating multiple swaths 304 of a scanning PID, in accordance with one or more embodiments of the present disclosure. In one embodiment, the PID physically interrogates the die 302 by scanning the illumination beam (e.g., illumination beam 116, or the like) across the sample 118 in a series of swaths 304 and detecting radiation emanating from the sample 118. Further, individual swaths 304 may truncate at the edge of each die 302 (e.g., as illustrated in FIG. 3B), extend past the edges of the die 302 (e.g., into scribe lines), or may extend across multiple dies 302. It is to be understood that the illustration of a scanning PID in FIG. 3B is provided solely for illustrative purposes and should not be interpreted as limiting. As described previously herein, a PID may utilize any number of sample analysis techniques such as, but not limited to, sequential imaging. In this regard, although not shown, each die 302 may be analyzed through a series of one or more images as measurement regions.

FIG. 3C is a top view of a single swath 304 illustrating multiple fields of view 306 of a DVD (e.g., DVD 106, or the like), in accordance with one or more embodiments of the present disclosure. In one embodiment, the DVD has a higher resolution, but a smaller field of view than the PID such that a swath 304 may include multiple fields of view 306 of the DVD. It is noted that the fields of view 306 of the DVD need not align with a particular swath 304 of the PID as illustrated in FIG. 3C. For example, the fields of view 306 may span across two swaths 304 of the PID.

In another embodiment, each measurement region of the PID and/or the DVD (e.g., swaths 304, fields of view 306, or the like) may be assigned a learning potential value, which may operate as a figure of merit indicative of an expectation that an inspection of the particular measurement region may reveal defects and provide corresponding data suitable for refining the process window. In this regard, the learning potential value may operate as a priority metric such that inspection of high-priority measurement regions is expected to provide more data suitable for refining the process window than low-priority measurement regions. In another embodiment, the measurement regions of the PID and/or the DVD are divided into smaller sub-units (e.g., sub-swaths, sub-images, sub fields of view, or the like) in which each sub-unit may be assigned a separate learning potential value. Accordingly, the learning potential values may be more granular than the measurement region of a particular device.

The learning potential value for measurement regions (e.g., swaths 304, fields of view 306, or the like) may be based on any number of factors. For example, the learning potential values may be based on pattern confidence values of the patterns in each measurement region. In one instance, the learning potential values may be derived as a statistical measure of the pattern confidence values of the patterns in each measurement region (e.g., an average, a median, or the like). In another instance, the learning potential values may be based on a diversity of patterns such that measurement regions having a higher number of different patterns may have a higher learning potential value.

By way of another example, the learning potential values may be based on the deviation of lithography configurations from nominal lithography configurations. For example, it may be the case, but is not required to be the case, that measurement regions containing patterns fabricated with lithography configurations close to nominal configurations are relatively unlikely to fabricate with defects. Inspection of such measurement regions may be less probable to result in the detection of a defect that would result in the refining (e.g., narrowing) of the process window. Accordingly, such measurement regions may be assigned a relatively low learning potential. Conversely, it may be the case, but is not required to be the case, that measurement regions including patterns fabricated with lithography configurations far from nominal configurations are relatively likely to fabricate with defects. Inspection of such measurement regions may be more probable to result in the detection of a defect that would result in the refining of the process window. Accordingly, such measurement regions may be assigned a relatively high learning potential.

Further, the learning potential values may be based on a weighted combination of factors such as, but not limited to, a number (or count) of patterns, diversity of patterns, the pattern confidence values, or the lithography configurations.

In another embodiment, the PID provides a recordable physical measurement of the entire sample for subsequent defect analysis, but inspects only a selected portion of the sample for defects. It is recognized herein that defects identified by the PID must typically be verified by the DVD, which is a time-consuming process. Accordingly, it may be the case that attempting to identify all defects on a DOE sample on a first pass and subsequently verifying the identified defects in a first pass may not as efficient for process window qualification as inspecting targeted portions of the sample in a first pass, followed by subsequent iterative inspections of additional targeted portions of the sample. In this regard, an inspection recipe for the PID may include the locations of the sample to inspect for defects generated based on the pattern layout.

In this regard, the PID may provide a first-pass inspection of the sample based on the selected portion of the sample that may include, but is not limited to, selected patterns, selected lithography configurations, and/or selected measurement regions of the sample. Further, system resources (e.g., processing time, processing power, or the like) may be efficiently directed towards defect identification in the selected portion of the sample by the PID during the first-pass inspection, while the recordable data from the analysis of the sample with the PID (e.g., a recordable image of the sample, or the like) may be provided for subsequent analysis.

The portion of the sample selected for first-pass inspection by the PID may be selected based on a variety of factors.

For example, portions of the sample selected for first-pass analysis by the PID may be chosen to provide a coarse analysis of the process window. For example, the DOE sample may include a large number of patterns fabricated with relatively finely-spaced variations of lithography configurations. It may be the case that the overall detection efficiency may be improved by first analyzing patterns at a coarse spacing between lithography configurations, followed by a finer analysis only in targeted regions. In this regard, general trends may be determined with a relatively low number of datapoints in the coarse analysis. Subsequent analysis may then provide targeted inspection at critical points based on the coarse measurements. Accordingly, inspection time may be efficiently utilized.

By way of another example, portions of the sample selected for first-pass analysis by the PID may be chosen based on the learning potential values of measurement regions of the PID. For example, a selected number of measurements having relatively high learning potential values (e.g., a high expectation of providing data suitable for refining the process window) may be chosen for first-pass inspection.

By way of another example, portions of the sample selected for first-pass analysis by the PID may be chosen based on the physical distribution of patterns across the DOE sample. It may be the case that a test sample may include a wide range of patterns fabricated with varying lithography configurations physically dispersed across the sample. Because the PID is a physical instrument that generates data by physically interacting with the sample (e.g., via the illumination beam), portions of the sample selected for first-pass analysis by the PID may be chosen at least in part to include samples that are physically grouped (e.g., within common swaths, common fields of view, or the like).

By way of another example, portions of the sample selected for first-pass analysis by the PID may be chosen based on pre-selected care areas. For example, design data may be utilized to identify patterns and/or regions of the sample as care areas for the PID. In one instance, certain patterns may be identified that are expected to be susceptible to variations in lithography configurations (e.g., "weak" patterns) or are particularly critical to the operation of a fabricated device. In another instance, certain areas of the wafer may be flagged as having defects (e.g., pits, scratches, or the like) prior to patterning such that surrounding patterns may be carefully analyzed (e.g., to determine the impact of the defect) or rejected (e.g., to avoid errant data).

In another embodiment, the method 200 includes a step 208 of removing one or more lithography configurations associated with locations of the PID-identified defects from the process window. For example, PID-identified defects may include potential defects identified by the PID in step 204 that are subsequently verified by the DVD 106 in step 206. Accordingly, step 208 may include refining (e.g., narrowing) the initial process window based on the presence of defects.

As described previously herein, it may be the case that a certain number and/or type of defects may be acceptable for a given fabrication step, which may be described by a defect tolerance. In this regard, step 208 may include identifying and removing lithography configurations that produce defects on one or more patterns in violation of the selected defect tolerance.

In another embodiment, the values of the pattern confidence values and/or the learning potential values (e.g., of the PID and/or the DVD) are updated upon refinement of the process window. For example, it may be the case that removing certain lithography configurations from the process window may change the expected susceptibility of patterns to fabricate with defects within the refined process window, which may be reflected by updating the pattern confidence value. Similarly, the learning potential values of the measurement regions of the PID and/or the DVD may be updated to reflect increased knowledge of the process window and modified expectations of the probability that inspection of a particular measurement region will result in further refinement of the process window.

In another embodiment, the method 200 includes a step 210 of iteratively refining the process window by removing one or more lithography configurations associated with VID-identified defects identified through analysis of selected portions of stored PID data with the VID.

The VID may inspect any portion of the data generated and/or stored by the PID without requiring movement of the sample. In this regard, after inspection of the sample by the PID in step 204, the sample may be moved to the DVD for verification in step 206. Subsequently, the sample may remain in the DVD for the duration of the process window qualification to verify potential defects identified by the VID.

Further, the VID may access any portion of the PID data corresponding to any desired portion of the sample on demand. In this regard, the VID may inspect any selected measurement regions of the PID and/or the DVD (e.g., swaths 304, fields of view 306, or the like) without regard to the physical location on the sample. Further, the VID may inspect sub-units of the measurement regions (e.g., sub-swaths, sub-images, sub-fields of view, or the like). It is recognized herein that on-demand access to all portions of the sample for inspection with the VID may provide significant efficiency benefits relative to similar inspections on a PID, which would require time to translate the sample to a desired location and then take a measurement for analysis. Additionally, in the case that the sample is loaded in the DVD (e.g., for verification of previously identified potential defects), iterative analysis of the sample with the PID would require repetitive transfers of the sample between the DVD and the PID, which may introduce significant time delays and potential risk to the sample.

In another embodiment, the selected portions of stored PID data that are analyzed by the VID and verified by the DVD in each iteration of step 210 are selected (e.g., by the controller 108, or the like) based on an expectation that analysis will result in the detection of defects and the resulting refinement of the process window. In this regard, each iteration of step 210 includes the analysis of targeted portions of the sample (via the stored PID data) selected to optimize defect detection and avoid unnecessary data collection such that the process window may be efficiently determined to the desired accuracy.

For example, each iteration of step 210 may include analysis of a portion of the sample (e.g., a measurement region, a sub-unit of a measurement region, or the like) having patterns with pattern confidence values indicative of a high probability of fabricating with a defect such that the process window may be efficiently refined. By way of another example, each iteration of step 210 may include analysis of a portion of the sample (e.g., a measurement region, a sub-unit of a measurement region, or the like) having a learning potential value indicative of a high expectation of defects such that the process window may be efficiently refined.

In another embodiment, the pattern confidence values and/or the learning potential values (e.g., of the PID and/or the DVD) are updated upon refinement of the process window by each iteration of step 210. For example, it may be the case that removing certain lithography configurations from the process window may change the expected susceptibility of patterns to fabricate with defects within the refined process window, which may be reflected by updating the pattern confidence value. Similarly, the learning potential values of the measurement regions of the PID and/or the DVD may be updated to reflect increased knowledge of the process window and modified expectations of the probability that inspection of a particular measurement region will result in further refinement of the process window.

In another embodiment, the selected portions of stored PID data that are analyzed by the VID and verified by the DVD dynamically vary in size in each iteration of step 210. In this regard, the size of the portions of stored PID data analyzed in each iteration may be selected based on expected results and are not limited to limitations of a physical system. Further, it is recognized herein that iterative analysis of relatively small portions of the sample (e.g., sub-units of measurement regions the PID) with the VID may facilitate "time slicing" of the sample data and may provide efficient targeting of regions of the sample with high learning potential for rapid refinement of the process window.

In another embodiment, the VID and the DVD may operate in parallel to further increase the efficiency of the process window qualification. For example, the VID and the DVD may each operate on a queue of operations such that down-time for each device may be minimized. For example, a controller (e.g., controller 108, or the like) may provide a queue of recipes to the VID and/or the DVD. Further, the controller may interrupt and/or rearrange recipes in the queues as needed for efficient operation.

The selected portions of stored PID data that are analyzed by the VID and verified by the DVD in each iteration of step 210 may be selected using any technique known in the art such as, but not limited to, machine learning techniques, or neural networks (e.g., neural networks, or the like).

In another embodiment, the method 200 includes a step 212 of providing the process window when a selected end condition is met. For example, the process window may be provided as an output to a control system for controlling the parameters of a lithography tool within the process window.

The end condition may include any end condition suitable for signaling that a process window has been determined to a desired specification. For example, the end condition may be based on the learning potential values of measurement regions (e.g., swaths 304, fields of view 306, or portions thereof) across the sample.

Figure 4:
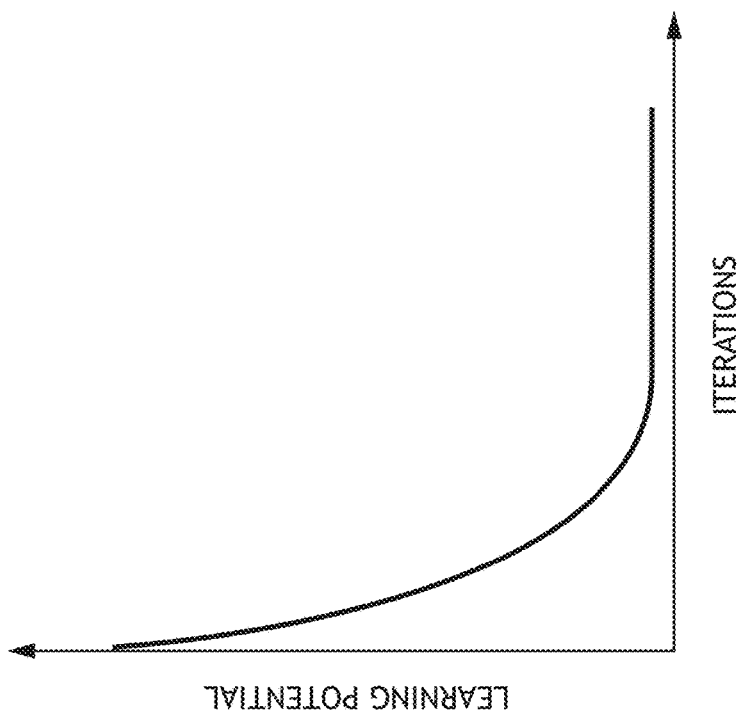
FIG. 4 is a plot of learning potential as a function of iterations, in accordance with one or more embodiments of the present disclosure.

FIG. 4 is a plot 400 of learning potential as a function of iterations, in accordance with one or more embodiments of the present disclosure. For example, plot 400 may be indicative of the learning potential of a particular measurement region or of a statistical representation of learning potential values across the sample (e.g., an average learning value, or the like). As illustrated in FIG. 4, it may be the case the learning potential values may drop as the number of iterations increases to indicate that the process window is being determined with increasing accuracy and/or confidence.

In one embodiment, the end condition includes one or more learning potential values of dropping below a selected threshold. For instance, the average (or a relevant statistical metric) of the learning potentials across the sample may drop below the selected threshold to indicate that the process window has been refined to the selected specification. In another embodiment, the end condition includes a rate of change of learning potential values of measurement regions (e.g., a learning rate) dropping below a selected threshold.

Further, some end conditions may terminate iterations of step 210 for reasons other than accuracy or confidence in the process window. For example, the end condition may include a selected number of iterations, a selected processing time for method 200, an interrupt command from a user, or the like.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. An inspection system, comprising:
 a controller communicatively coupled to a physical inspection device (PID), a virtual inspection device (VID) configured to analyze stored PID data, and a defect verification device (DVD), the controller including one or more processors configured to execute instructions causing the one or more processors to:
  receive a pattern layout of a sample, the sample including a plurality of patterns fabricated with selected lithography configurations defining a process window, the pattern layout correlating locations of the plurality of patterns on the sample to the lithography configurations of the process window;
  receive locations of PID-identified defects identified through analysis of the sample with the PID, wherein the PID-identified defects are verified by the DVD;
  remove one or more lithography configurations associated with the locations of the PID-identified defects from the process window;
  iteratively refine the process window, wherein a particular iteration comprises:
   select a portion of stored PID data for analysis with the VID;
   receive locations of VID-identified defects identified through analysis of the selected portion of stored PID data with the VID, wherein the VID-identified defects are verified by the DVD; and
   remove one or more lithography configurations associated with VID-identified defects from the process window; and
  provide, as an output, the process window when a selected end condition is met.

2. The inspection system of claim 1, wherein the one or more processors are further configured to execute instructions causing the one or more processors to:
 assign figures of merit to the plurality of patterns indicative of a number of lithography configurations in the process window for which the plurality of patterns are fabricated with defects, wherein the selected portions of stored PID data analyzed by the VID are selected based on the figures of merit.

3. The inspection system of claim 2, wherein select the portion of stored PID data for analysis with the VID comprises:
 select the portion of stored PID data for analysis with the VID by maximizing, within a selected specification, a diversity of patterns with figures of merit within a selected range.

4. The inspection system of claim 2, wherein select the portion of stored PID data for analysis with the VID comprises:
 select the portion of stored PID data for analysis with the VID by maximizing, within a selected specification, a number of patterns with figures of merit within a selected range.

5. The inspection system of claim 2, wherein the particular iteration further comprises:
 update the figures of merit based on the VID-identified defects removed from the process window.

6. The inspection system of claim 2, wherein the one or more processors are further configured to execute instructions causing the one or more processors to:
 correlate the plurality of patterns to one or more swaths of an analysis of the sample with the PID; and
 assign learning potential values to the one or more swaths based on the figures of merit of the plurality of patterns within the one or more swaths, wherein the selected portions of stored PID data analyzed by the VID are selected based on the values of the learning potential of the one or more swaths.

7. The inspection system of claim 6, wherein the learning potential values are indicative of at least one of a diversity of patterns with figures of merit satisfying a selected criterion or a number of patterns with figures of merit satisfying the selected criterion.

8. The inspection system of claim 6, wherein the learning potential values of the one or more swaths are indicative of a predicted probability of the one or more swaths including fabrication defects.

9. The inspection system of claim 6, wherein select the portion of stored PID data for analysis with the VID comprises:

select at least a portion of a swath of stored PID data for analysis with the VID based on the learning potential.

10. The inspection system of claim 8, wherein the particular iteration further comprises:
update the learning potential value of the one or more swaths based on the VID-identified defects.

11. The inspection system of claim 10, wherein update the learning potential value of the one or more swaths based on the VID-identified defects comprises:
decrement the learning potential value of the one or more swaths.

12. The inspection system of claim 11, wherein the selected end condition comprises:
the one or more swaths having learning potential values below a selected threshold.

13. The inspection system of claim 2, wherein the one or more processors are further configured to execute instructions causing the one or more processors to:
correlate the plurality of patterns to one or more fields of view of the DVD; and
assign learning potential values to the one or more fields of view based on the figures of merit of the plurality of patterns within the one or more fields of view, wherein the selected portions of stored PID data analyzed by the VID are selected based on the values of the learning potential of the one or more fields of view.

14. The inspection system of claim 13, wherein the learning potential values are indicative of at least one of a diversity of patterns with figures of merit satisfying a selected criterion or a number of patterns with figures of merit satisfying the selected criterion.

15. The inspection system of claim 13, wherein the learning potential values of the one or more fields of view are indicative of a predicted probability of the one or more fields of view including fabrication defects.

16. The inspection system of claim 13, wherein select the portion of stored PID data for analysis with the VID comprises:
select at least one field of view of the one or more fields of view with the VID based on the learning potential.

17. The inspection system of claim 13, wherein the particular iteration further comprises:
update the learning potential value of the at least one selected field of view based on the VID-identified defects.

18. The inspection system of claim 17, wherein update the learning potential value of the at least one selected field of view based on the VID-identified defects comprises:
decrement the learning potential value of at least one selected field of view.

19. The inspection system of claim 18, wherein the selected end condition comprises:
the one or more fields of view having learning potential values below a selected threshold.

20. The inspection system of claim 1, wherein the selected end condition comprises:
a selected number of iterations.

21. The inspection system of claim 1, wherein the selected end condition comprises:
a selected runtime.

22. The inspection system of claim 1, wherein the PID comprises:
at least one of an optical inspection system or an electron beam inspection system.

23. The inspection system of claim 1, wherein the DVD comprises:
at least one of a review scanning electron microscope, a critical-dimension scanning electron microscope, or an inspection scanning electron microscope.

24. The inspection system of claim 1, wherein the one or more processors are further configured to execute instructions causing the one or more processors to:
remove one or more lithography configurations associated with the locations of the PID-identified defects from the process window prior to iteratively refining the process window.

25. An inspection system, comprising:
a physical inspection device (PID);
a virtual inspection device (VID) configured to analyze stored PID data;
a defect verification device (DVD); and
a controller communicatively coupled to the PID, the VID, and the DVD, the controller including one or more processors configured to execute instructions causing the one or more processors to:
receive a pattern layout of a sample, the sample including a plurality of patterns fabricated with selected lithography configurations defining a process window, the pattern layout correlating locations of the plurality of patterns on the sample to the lithography configurations of the process window;
receive locations of PID-identified defects identified through analysis of the sample with the PID, wherein the PID-identified defects are verified by the DVD;
iteratively refine the process window, wherein a particular iteration comprises:
select a portion of stored PID data for analysis with the VID:
receive locations of VID-identified defects identified through analysis of the selected portion of stored PID data with the VID, wherein the VID-identified defects are verified by the DVD; and
remove one or more lithography configurations associated with VID-identified defects from the process window; and
provide, as an output, the process window when a selected end condition is met.

26. The inspection system of claim 25, wherein the one or more processors are further configured to execute instructions causing the one or more processors to:
remove one or more lithography configurations associated with the locations of the PID-identified defects from the process window prior to iteratively refining the process window.

27. An inspection method, comprising:
receiving, with one or more processors, a pattern layout of a sample, the sample including a plurality of patterns fabricated with selected lithography configurations defining a process window, the pattern layout correlating locations of the plurality of patterns on the sample to the lithography configurations of the process window;
inspecting the sample with a physical inspection device (PID) to generate PID-identified defects;
verifying the PID-identified defects with a defect verification device (DVD);
iteratively refining the process window, wherein a particular iteration comprises:
selecting, with one or more processors, a portion of stored PID data for analysis with a virtual inspection device (VID);
receiving, with one or more processors, locations of VID-identified defects identified through analysis of the selected portion of stored PID data with the VID, wherein the VID-identified defects are verified by the DVD; and removing, with one or more processors, one or more lithography configurations associated with VID-identified defects from the process window; and providing, with one or more processors, the process window as an output when a selected end condition is met.

28. The inspection method of claim 27, further comprising:

assigning, with one or more processors, figures of merit to the plurality of patterns indicative of a number of lithography configurations in the process window for which the plurality of patterns are fabricated with defects, wherein selecting the portion of stored PID data for analysis with the VID comprises:

selecting the portion of stored PID data for analysis with the VID based on the figures of merit.

29. The inspection method of claim 28, wherein selecting the portion of stored PID data for analysis with the VID based on the figures of merit comprises:

selecting the portion of stored PID data to include a selected number of patterns of the plurality of patterns with a selected number of lithography configurations in the process window associated with fabrication defects.

30. The inspection method of claim 28, wherein selecting the portion of stored PID data for analysis with the VID based on the figures of merit comprises:

selecting the portion of stored PID data to include a selected diversity of patterns of the plurality of patterns with a selected number of lithography configurations in the process window associated with fabrication defects.

31. The inspection method of claim 28, wherein the iteration further comprises:

updating updating, with one or more processors, the figures of merit based on the VID-identified defects removed from the process window.

32. The inspection method of claim 27, further comprising:

removing, with one or more processors, one or more lithography configurations associated with the locations of the PID-identified defects from the process window prior to iteratively refining the process window.

* * * * *